United States Patent [19]
Roberts

[11] Patent Number: 5,196,819
[45] Date of Patent: Mar. 23, 1993

[54] PRINTED CIRCUITS CONTAINING FUSE ELEMENTS AND THE METHOD OF MAKING THIS CIRCUIT

[75] Inventor: Joseph A. Roberts, Hudson, N.H.
[73] Assignee: Rock Ltd. Partnership, Nashua, N.H.
[21] Appl. No.: 855,747
[22] Filed: Mar. 23, 1992

Related U.S. Application Data

[63] Continuation-in-part of Ser. No. 662,256, Feb. 28, 1991, Pat. No. 5,099,219.

[51] Int. Cl.$^5$ .................... H01H 85/04; H01H 85/43
[52] U.S. Cl. ................................. 337/297; 337/231; 29/623
[58] Field of Search ................ 337/297, 231; 29/423; 361/398

[56] References Cited
U.S. PATENT DOCUMENTS
4,771,260  9/1988  Gurevich ........................... 337/231

*Primary Examiner*—Harold Broome
*Attorney, Agent, or Firm*—Davis, Bujold & Streck

[57] ABSTRACT

A fusible printed circuit includes one or more conductors extending along a dielectric substrate. The circuit can be flexible or rigid. Each conductor is comprised of a layer of electrically conductive material and has one or more gaps formed in the conductive layer at locations opposite a segment of the fusible material so that electrical current flowing through each conductor is required to pass, in its entirety, through the segment of fusible material at the location of each gap in the layer of conductive material. The integral fuses are designed to specific electrical parameters and may be located randomly along circuit runs. The fusible material is cold welded to the conductors at the gaps. Pressure concentrators support the fuses and minimize motion stress on the fuses. The fuses can be sealed within a protective overlay which captures debris when the fuses are blown and controlled venting of the debris can also be provided. The use of such a circuit to incorporate a variety of fuses having different fuse ratings into the conductive paths of a printed circuit is also disclosed, as are methods of making fusible flexible circuits.

10 Claims, 6 Drawing Sheets

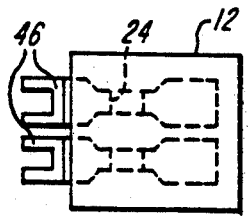 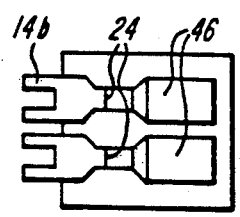 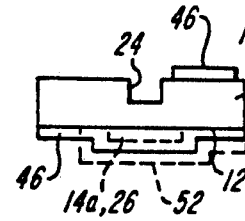 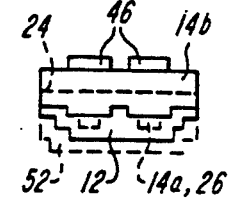
FIG. 7A  FIG. 7B  FIG. 7C  FIG. 7D
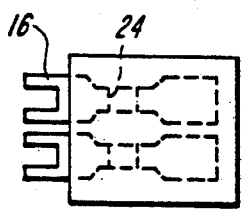 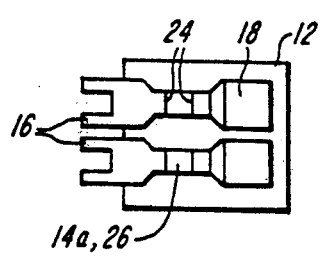 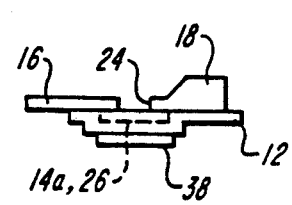 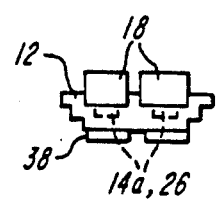
FIG. 8A  FIG. 8B  FIG. 8C  FIG. 8D
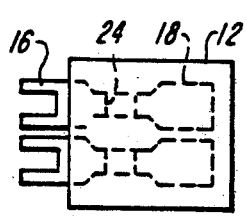 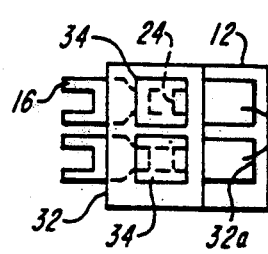 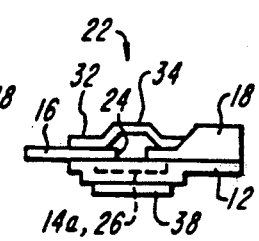 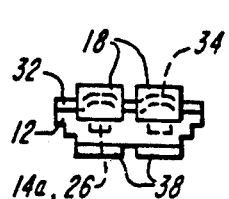
FIG. 9A  FIG. 9A  FIG. 9A  FIG. 9A

PRINTED CIRCUITS CONTAINING FUSE ELEMENTS AND THE METHOD OF MAKING THIS CIRCUIT

CROSS-REFERENCE TO RELATED APPLICATIONS

This application is a continuation-in-part of U.S. patent application Ser. No. 662,256, filed Feb. 28, 1991, now U.S. Pat. No. 5,099,219, granted Mar. 24, 1992.

BACKGROUND OF THE INVENTION

This invention relates to printed circuits, and in particular, to a circuit which incorporates integral fuses at selected locations along the circuit conductors.

In today's competitive electronics market, manufacturers are placing additional emphasis on reducing direct labor costs and increasing product reliability. This emphasis is easily understood when it is realized that today's manufacturers purchase all of their components and most of their subassemblies from outside suppliers. Their main task is to assemble and interconnect all components and subassemblies found within their product. The majority of these components are still interconnected using wire. However, a growing trend is the use of flexible printed circuits for such interconnections.

Each such circuit is custom designed to a specific length, current carrying capacity and geometric shape to fit the package. This circuit is, in fact, an engineered component and, as such, can be incorporated into volume assembly techniques as are other components. Flexible printed circuits are easily tested and quickly connected with no chance of wiring errors. For these reasons, the circuits are gaining wide acceptance with today's electronic manufacturers.

In an electrical circuit, it is desirable to have fuses at selected locations in the circuit runs to protect various electrical components from power surges. This is particularly so in the case of flexible printed circuits which establish electrical connections between many different components and subassemblies of electrical equipment such as data processing apparatus, communications apparatus, power supplies, diode amplifiers, etc.

Conventionally, such fuses are incorporated into the printed circuit as separate components or multiple fuse modules which must be connected electrically and mechanically to the circuit. However, prior fuses and fuse modules are relatively large and, as the conductor paths of printed circuits have become finer and more closely spaced, it has become increasingly more difficult to incorporate these fusible elements into the circuitry. It is desirable, therefore, to provide a better way of incorporating fuses into flexible printed circuits.

Accordingly, the present invention aims to provide a printed circuit having integral fuses present at selected locations along the circuit conductors.

Another object of the invention is to provide an improved fusible fine line printed circuit.

A further object of the invention is to provide a fusible flexible printed circuit which is resistant to motion stress during fabrication and installation.

Another object is to provide a flexible printed circuit with integral fuses whose fuse ratings can be set precisely.

Still another object of the invention is to provide a fusible flexible printed circuit which is relatively easy and inexpensive to make.

Another object of the invention is a fusible printed circuit which can accommodate materials, such as aluminum, that are not economically applicable to a conventional electroplating process.

Yet a further object of the invention is a fusible printed circuit able to provide for a controlled discharge in those applications requiring it.

SUMMARY OF THE INVENTION

The fusible circuit includes conductors which are mounted to and meander along a suitable electrically insulating substrate. The substrate can be flexible so that the circuit can function as a harness or interconnect.

The circuit differs from the usual printed circuit, however, in that one or more of its conductors or runs incorporates an integral fuse. Each fusible conductor or run is interrupted by a suitable fusible material. Each integral fuse is designed to specific electrical parameters (i.e. length, width, thickness) and may be located at any random position along a given run. At the location of each fuse, the electrical current passing through the interrupted conductive layer is required to pass in its entirety through the fusible material at the location of a gap in the conductor. To form the fuses, the conductive layer segments of the printed circuit can be omitted or removed by chemical milling or etching techniques and a fuse material cold welded or pressure fused at the gap. The resistive characteristics of the fuses and their fuse ratings can be controlled quite precisely.

The circuit can also have an insulating cover or overlayer formed with integral bubbles or domes over the circuit fuses. These bubbles encapsulate and protect the fuses and provide controlled spaces for the fuses to blow clean so as to minimize damage to and contamination of adjacent circuit runs.

Further, if desired, the circuit runs can be provided with integral terminating areas or pads which are raised above the insulating overlayer to protect the electrical integrity of the pads by eliminating the possibility of glue flow to those pads and to facilitate component placement and attachment to the circuit.

The present invention is applicable to fine-line printed circuits whose conductive paths are quite narrow and densely packed on the substrate. As will be described in more detail below, the fusible circuits are relatively easy and inexpensive to make and they provide a quick and convenient structure for incorporating integral fuses into the otherwise unfused conductor runs or paths of a flexible printed circuit. The invention thus enhances the quality of fusible flexible or rigid circuits, while materially reducing the cost of such circuits. In the description which follows, flexible circuits will be described; however, the integral fuses according to the invention find equal applicability to rigid circuits.

In another aspect of the invention, a fusible circuit features a dielectric substrate and at least one electrical circuit path adhered to the substrate, at least one of the paths being a fused path. The fused path has a layer of electrically conductive material defining a gap between juxtaposed ends in the path, and a layer of fusible material extending between the ends and pressure welded to the conductive material at the ends. Thereby, electrical current flowing along each of the fused paths in conducted primarily through the conductive material layer except at the location of each gap where it is conducted solely through the fusible material layer. The circuit also features a force concentrating layer adhered in a position opposite each gap, and the force concentrating layer can have venting ports for controlling debris discharge.

The method of making a fusible printed circuit, in another aspect of the invention, features the steps of forming a dielectric substrate, forming at least one conductive path of the printed circuit on the substrate, each said path having a gap between juxtaposed conductive ends, and cold welding a layer of fusible material to the juxtaposed ends of each fusible conductive path. The method further features the step of laminating a force concentration element, the fusible material, and the conductive paths for cold fusing the fusible material to the conductor ends.

BRIEF DESCRIPTION OF THE DRAWINGS

Other objects, features and advantages of the invention will be apparent from the following description, taken in connection with the accompanying drawings, in which:

FIGS. 4A to 9D are diagrammatic views illustrating the steps followed to make to the FIG. 1 circuit;

DESCRIPTION OF PREFERRED PARTICULAR EMBODIMENTS

Figure 1:
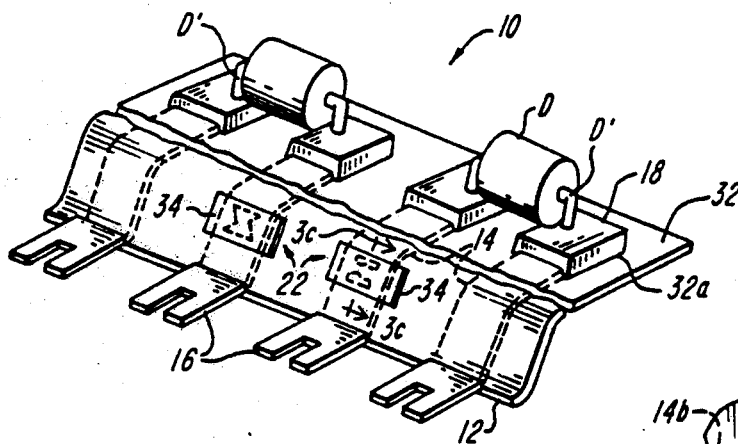
FIG. 1 is a fragmentary isometric view of a fusible flexible printed circuit made in accordance with our invention.

Referring to FIG. 1 of the drawings, a flexible printed circuit incorporating the invention is indicated generally at 10. Circuit 10 comprises a flexible dielectric substrate 12 of the type commonly used in the manufacture of flexible printed circuits. Extending along the surface of substrate 12 are one or more conductive runs or paths 14. For ease of illustration, we have shown these runs as being relatively large and widely spaced. In actuality, they may be fine line conductors on the order of only 0.005 inch wide.

In a typical flexible circuit or interconnect, there may be many such conductive paths 14 extending more or less in parallel the entire length of the circuit 10. Typically, these conductive paths lead to terminals or pads at the opposite ends of the circuit which establish electrical connections between paths 14 and the terminals of electrical components, PC boards, modules or the like. In the illustrated circuit 10, the runs 14 connect bayonet-type terminals 16 suitable for coupling to mating terminals on a PC board and raised terminating areas or pads 18 suitable for mounting, say, a diode.

In accordance with this invention, selected circuit runs 14 are formed with integral fuses shown generally at 22 at selected locations along their lengths. If any one of the fused paths 14 of circuit 10 is exposed to excessive current, the fuse 22 in that path will fuse or break, thereby interrupting current flow along that path. The remaining paths 14 of circuit 10 will be unaffected and will continue to carry current between the components and circuits to which the circuit 10 is connected.

Figure 2:
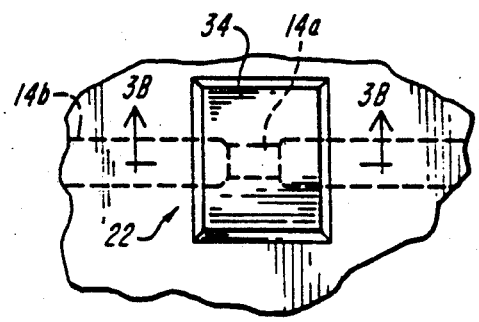
FIG. 2 is a fragmentary plan view on a much larger scale showing a fusible portion of the FIG. 1 circuit.
Figure 3A:
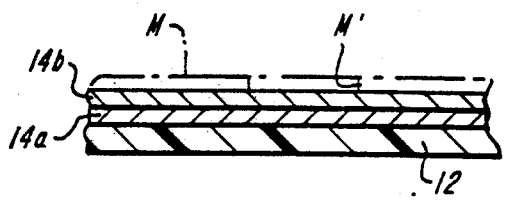
FIG. 3A is a sectional view showing a typical bimetallic circuit conductor before a fuse is formed therein by creating a gap in the conductive layer of the circuit.
Figure 3B:
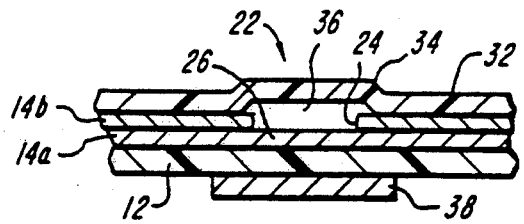
FIG. 3B is a sectional view along line 3B—3B of FIG. 2 showing a circuit conductor incorporating an integral fuse.

Referring now to FIGS. 2 and 3B, according to one embodiment of the invention, at least at the locations of fuses 22, each circuit path 14, instead of being a single conductive layer as in a conventional printed circuit, is a bimetallic structure. In other words, each run or path 14 includes a first layer 14a next to substrate 12 of a fusible material such as a lead-zinc alloy and a second layer 14b on layer 14a consisting of an electrically conductive material such as copper metal. The two layers 14a and 14b can be electroplated and may extend in superposition along the entire length of each circuit path 14, although in actuality, layer 14a only has to be present at the locations of the fuses 22.

The dimensions of the upper or outer conductive layer 14b are selected so that layer 14b by itself can carry the current that will normally flow in path 14. In a typical circuit, for example, layer 14b may be on the order of 0.001 inch high and 0.005 inch wide. The fusible underlayer 14a may be more or less the same width as layer 14b. Its height or thickness, however, is selected to provide a layer cross section that will yield the fuse rating desired for the particular fuse 22. A typical thickness for a lead-zinc alloy layer 14a is 0.0002 to 0.001 inch.

The fused conductive paths 14 of circuit 10 can be formed using the very same imaging and etching or chemical milling techniques customarily used to make printed circuits, one such method being disclosed in U.S. Pat. No. 4,357,750. In this case, of course, since each path 14 has a bimetallic segment, two imaging and etching sequences may be required to form the two conductor layers 14a and 14b in each such segment.

Also in accordance with conventional procedures, the conductor layers can be layed down directly on substrate 12 or the bimetallic circuit paths can be etched from a bimetallic sheet and subsequently be adhered or bonded to substrate 12. Also, of course, in the case of gross or wide line circuits, the paths 14 can simply be stamped mechanically from a bimetallic sheet.

The circuit paths 14 can be made fusible at the fuses 22 along their lengths simply by omitting or removing the conductive layer 14b from those segments. This can be accomplished by masking the circuit at segments 16, one such mask being indicated in phantom at M in FIG. 3A. The mask has a window M' that exposes each circuit path segment 16 so that the portion of layer 14b exposed in the mask window can be milled or etched away without damaging or attacking the underlying fusible layer. Most preferably, however, in a first preferred embodiment of the invention, the fuses 22 are made by the method steps described in connection with FIGS. 4A to 9D.

In any case, as shown in FIGS. 2 and 3B, the removal of the layer 14b material at each fuse 22 leaves a gap 24 in the conductive layer of the run 14 which registers with a segment 26 of the underlying layer 14a of fusible material. Thus, in the area of gap 24, all of the current carried by that run 14 is routed through fusible metal segment 26. Therefore, by properly controlling the cross section of segment 26, that segment can be made to have a selected current-carrying capacity or rating. Since the segment 26 can be dimensioned very accurately when the circuit 10 is being printed, the fuse rating can be controlled precisely. If that capacity should be exceeded, the segment 26 will blow or melt, thereby creating a gap or open circuit in the associated path 14 so that that path will no longer conduct current between the terminals 16 and 18 of that path. For example, in FIG. 1, the right hand fuse 22 has blown creating a gap G in the right hand circuit run 14.

Figure 3C:
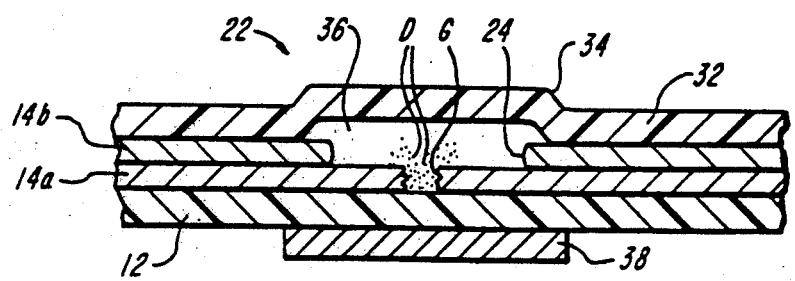
FIG. 3C is a similar view on a larger scale taken along line 3C—3C of FIG. 1 showing a blown fuse.
Figure 4A:
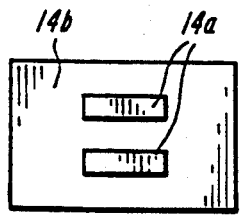
Figure 4B:
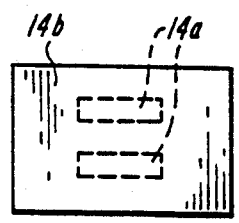
Figure 4C:
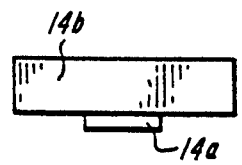
Figure 4D:
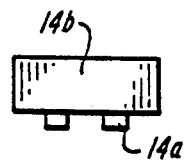

As best seen in FIGS. 3B and 3C, circuit 10 preferably includes an overlayer 32 of flexible dielectric material which overlies conductors 14. Overlayer 32 may be of the same material as substrate 12 and be laminated or adhered to substrate 12 and the conductors. Desirably in this event, overlayer 32 is formed with bubbles or domes 34 over the various fuses 22. These bubbles or domes perform several functions. First, they, and the air entrapped within, act as shock absorbers to shield the fuses 22, which are the weakest parts of circuit 10, from impact forces. Secondly, the bubbles provide some structural support and insulation for the fuses 22. In addition, they protect the fuses 22 from chemical and mechanical damage. The bubbles or domes 34 also provide controlled hermetically sealed voids or spaces 36. These spaces will capture and confine any carbon debris and gases, shown at D in FIG. 3C, generated when a segment 26 of the fusible layer 14a, blows or melts due to excessive current passing through that segment. But for the presence of the bubbles 34, gases and debris could blow out and damage or contaminate adjacent circuit paths. The bubbles also allow fuses 22 to blow "clean" minimizing carbon traces and current leakage.

To minimize motion stress on the fuses 22 in circuit 10 during manufacture of the circuit and afterwards, the circuit may also include metal reinforcing or stabilizing strips 38 under the fuses 22 as shown in FIGS. 3B and 3C. These strips are applied to the underside of the circuit substrate 12 early on in the manufacturing process. Strips 38 protect the fusible layer 14a during the manufacturing process and they may remain on the circuit 10 for its useful life. The metal strips 38 also constitute heat sinks under the fuses 22 allowing the manufacturer of circuit 10 to maintain very close control over the fusing characteristics of the various fuses 22 during an overload condition.

Referring now to FIGS. 4A to 9D, which illustrate the first preferred method of making the FIG. 1 circuit 10, in the drawing figures, thicknesses have been exaggerated for clarity. Also, in the drawing figures, an "A" following the figure number indicates a bottom view, a "B" indicates a plan view and the letters "C" and "D" indicate side and end views, respectively.

As shown in FIGS. 4A to 4D, first fusible metal layers 14a are applied (e.g., plated, inlaid or pressure fused) to conductive metal layer 14b at those locations where fuses 22 are to be formed in circuit 10.

The particular metal of layer 14a is selected for its current carrying capacity and other characteristics to accommodate the type of fuse desired, for example, slow-blow, standard, surge, etc.

Figure 5A:
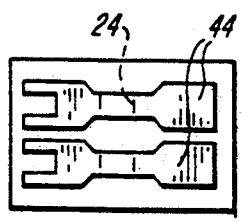
Figure 5B:
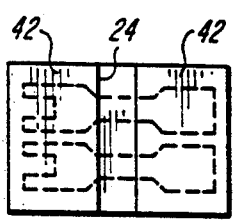
Figure 5C:
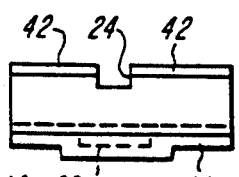
Figure 5D:
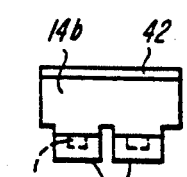
Figure 6A:
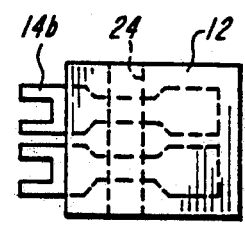
Figure 6B:
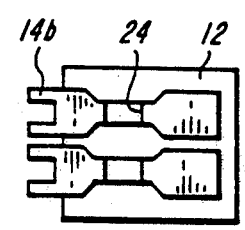
Figure 6C:
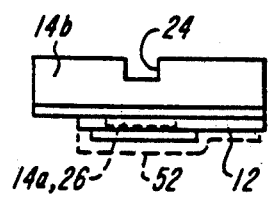
Figure 6D:
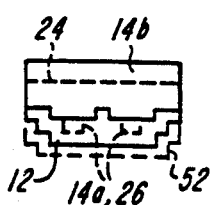

Next, as seen in FIGS. 5A to 5D, the resulting bimetallic structure is coated with a top resist coating 42 and a bottom resist coating 44 and etched to define the fuse gap 24 (FIGS. 5B and 5C) and the conductor pattern (FIG. 5A). Once defined, each conductor is developed by etching from both faces to a depth equal to the approximate thickness of the conductor pattern.

Then, after removing the resist coatings 42 and 44, the dielectric substrate 12 is laminated to the undersides of fusible layers 14a and the conductive layer 14b as shown in FIGS. 6A to 6D. If the circuit is to include the metal stabilizing strips 38 under fuses 22, the substrate should be a composite including a metal underlayer 52, for example, of copper, as shown in phantom in FIGS. 6C and 6D. Thus, layer 52 provides support for the relatively small thin fusible metal layers 14a.

There is now a second imaging step to protect the terminal areas of layer 14b and to deepen the fuse gap 24. In this step, a resist coating 46 is applied over the areas of layer 14b corresponding to terminals 16 and the terminal pads 18 as shown in FIGS. 7A to 7D. After a second etch and removal of the resist coating according to FIGS. 8A to 8D, the definitions and reduction in thickness of the conductors 14 and the definition of the fuse gap are complete. Note from FIGS. 8C and 8D that the terminal pads 18 at the ends of the conductor runs 14 have more or less the same thicknesses as the original conductive layer 14b shown in FIGS. 4A to 4D.

Also, if the circuit is to include the metal stabilizing strips 38, the metal layer 52 is etched to shape the strips 38 as shown in FIGS. 8C and 8D so that they stabilize and support the fuses 22 without restricting circuit 10 flexibility. The strips may have a variety of different shapes. For example, they may be rectangular as shown in the figures or the adjacent strips may be joined by a web of metal to form a single large H-shaped metal structure under the fuses which constitutes an efficient heat sink.

The final step in the process of making circuit 10 is to laminate the overlayer 32 to the upper face of the composite structure as shown in FIGS. 9A to 9D. First, however, holes 32a are provided in the overlayer to provide clearance for terminal pads 18. Also, the overlayer is vacuum formed or molded to create the bubbles 34.

As the fuses 22 are arranged on conductive layer 14b, the bubbles 34 are located on overlayer 32 so that when the overlayer is registered to the conductive layer and laminated to it using a pre-shaped template (not shown), the bubbles 34 will be located precisely over fuses 22. When the circuit 10 is completed, in one embodiment of the invention, the terminal pads 18 project above (for example, 0.001 to 0.025 inch) overlayer 32 so that they can serve as mounting pedestals for circuit components as shown in FIG. 1.

The exiting terminals 16, on the other hand, are quite thin and may or may not be supported by one or the other of substrate 12 and overlayer 32. In other words, one of those layers, for example, substrate 12, can extend beyond the other layer under terminals 16 to provide support for those terminals.

Note that when circuit 10 includes the stabilizing strips 38, those strips maintain the integrity of the fine line fuse segments 26 as they proceed through the process of making circuit 10 until they are completely entrapped by the dielectric layers 12 and 32 and thereafter. Since those layers stabilize the fuse segments, strips 38 can then be removed if desired for one reason or another.

Figure 10A:
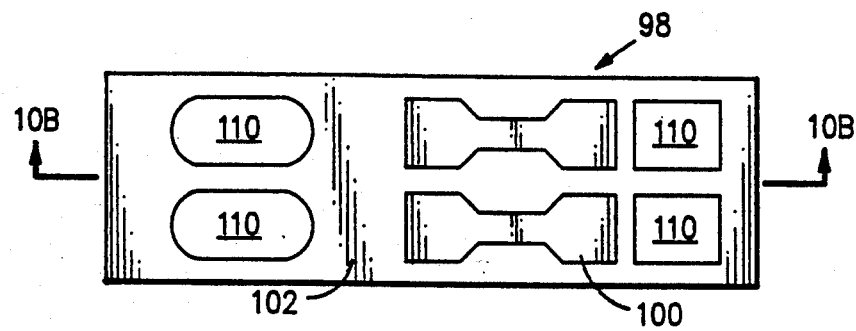
FIGS. 10A and 10B are top and cross-sectional views, respectively, of the fuse array prior to etching in accordance with the second illustrated embodiment of the invention.
Figure 10B:
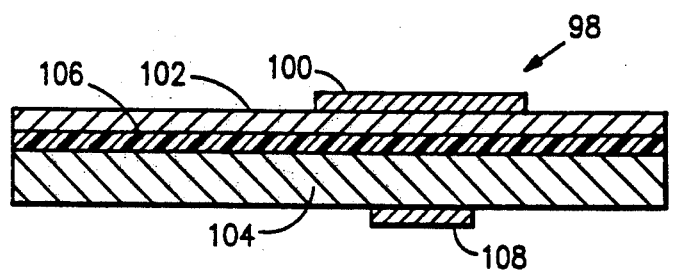

In accordance with a second preferred embodiment of the invention, the fuse structure can be advantageously constructed using a cold welding process. In accordance with this embodiment, an initial fuse array structure 98 provides, referring to FIGS. 10A and 10B, for a fuse resist 100 overlaying a fusible material layer 102. The fusible material layer is insulated from a force concentration material layer 104 by an insulating material 106. A second resist coating 108 is used to define the force concentrator which will be associated with the fuse for this structure. The fused link and force concentrator are thus manufactured by first laminating the required materials together. In one particular embodiment of this structure, a sheet of 0.001 inch thick aluminum, the fusible material 102, is laminated to a sheet of, 0.005 inch thick brass (which will become the force concentrator), using a sheet of 0.001 inch thick Kapton which is adhesively coated on both sides. The Kapton acts as the insulating material 106 isolating the fusible material from the force concentrator. The laminate is first drilled or punched, for example at 110, to remove the insulation from those areas which overlie the component terminating areas in the finished circuit. The array 98 is then imaged, with the photoresist materials in place, in preparation for etching.

Figure 11A:
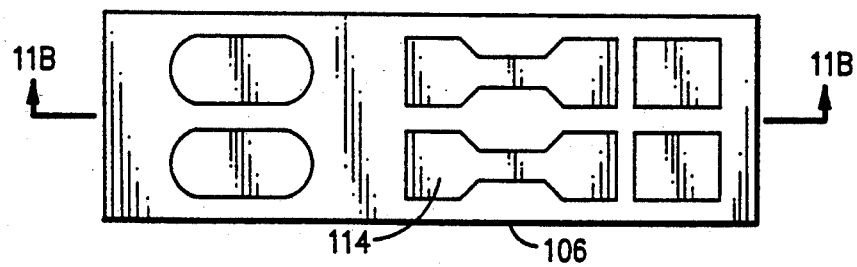
FIGS. 11A and 11B are top and cross-sectional views, respectively, of the fuse array after etching.
Figure 11B:
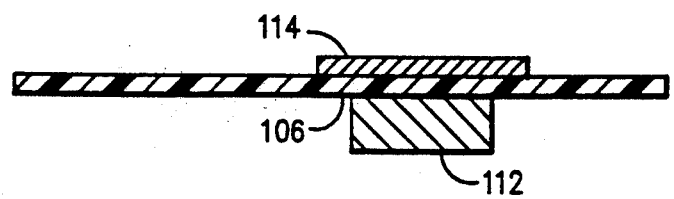

After etching, referring to FIGS. 11A and 11B, the force concentrator 112, which corresponds to the support stabilizer 38 in the earlier described embodiment, can be further shaped, if necessary, by routing, etching, casting, molding, or another process, to a configuration which will force the fused material 114, now shaped and etched, into the gap between the conductor ends and to cause it to be pressure fused to the conductors during a subsequent laminating process. Thus, essentially as a byproduct of the laminating process, the fusible material will be connected to and provide the fusible link between the conductor ends. In addition, the force concentrator is designed to support the fuse while not restricting the flexibility of the circuit.

The force concentrator can be shaped in any desired configuration, and built using any desirable materials such as, for example, metals or ceramics. The material is selected as required to perform the specific design function. The primary functions are to (i) register the fuse to the conductor network; (ii) distribute the required force necessary to pressure fuse (or cold weld) the fuse link to the conductor network during the laminating process; (iii) support the fuse and not restrict the circuit flexibility when required; and (iv) as described in more detail below, act as a focused venting port in those applications which require a controlled discharge.

Thus, the structure of FIG. 10 is etched, after imaging, with an acid resistant ink, on both sides, resulting, as illustrated in FIGS. 11A and 11B, with the removal of all unwanted material, thereby defining the shape and the location of both the fuse link material layer 102 and the force concentrator material layer 104. The fused array structure of FIGS. 11A and 11B is then stored in preparation for a final assembly process.

Figure 12A:
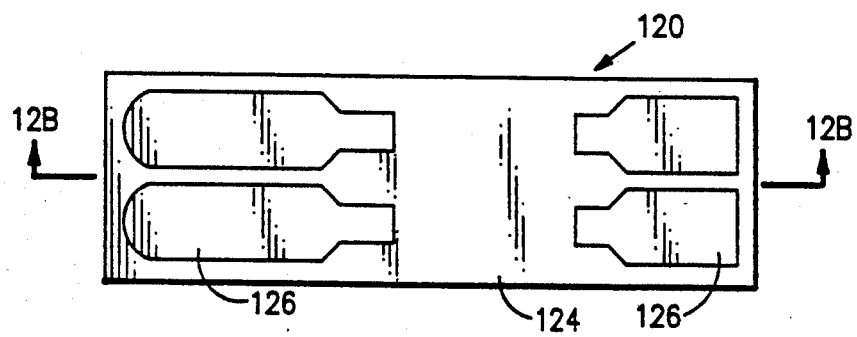
FIGS. 12A and 12B are top and cross-sectional views, respectively, of the conductor array prior to etching.
Figure 12B:
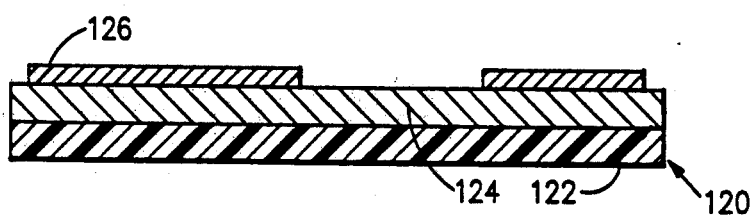
Figure 13A:
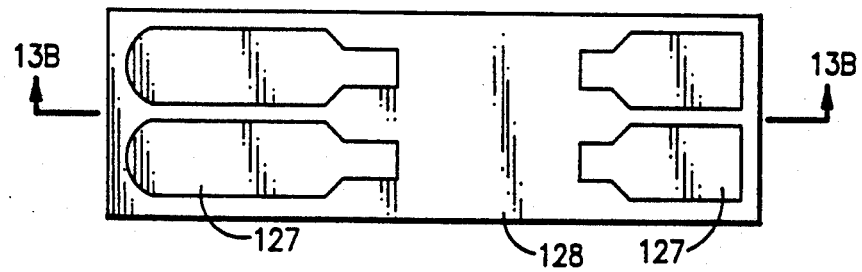
FIGS. 13A and 13B are top and cross-sectional views, respectively, of the conductor array after etching.
Figure 13B:
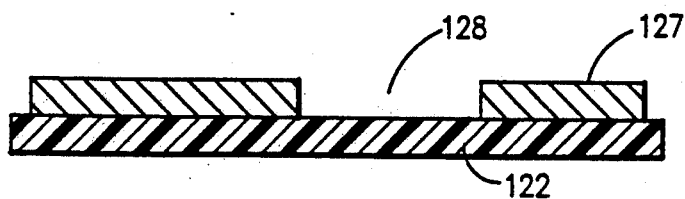

Referring now to FIGS. 12A and 12B, the conductor circuit pattern 120 is prepared by first laminating a desired insulation 122 (for example, 0.001 inch thick Kapton with adhesive on one side only) to an acceptable conductive material 124 (for example, 0.004 inch copper). The laminate is then coated with a resist material 126, imaged and developed as is well known in the art, in preparation for etching. The circuit pattern is then etched, after development, by subjecting the unprotected conductive material to a commercial etching solution. This process defines the conductor pattern 127 on the preferably flexible substrate leaving in place a desired gap 128 (FIG. 13) at which the fuse link is to be inserted. The conductor pattern is then cleaned as well known in the art, in preparation for a final lamination step.

Figure 14:
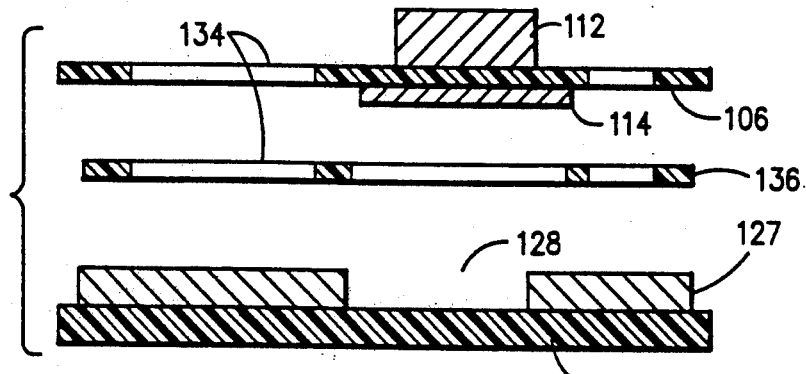
FIG. 14 is illustrates the assembly of the conductor array and fuse array together with an insulating layer in accordance with the second embodiment of the invention.

Referring to FIG. 14, the fuse array 130 and the conductor array 132, are then assembled, and placed and aligned in juxtaposition to each other. The etched circuit pattern is registered with the fuse array structure in a precise manner using an alignment fixture (not shown), in preparation for the final lamination process. Pre-drilled or punched openings 134 which can be used for connecting to the conductor array are provided in the both the fuse array as well as an insulating material 136. The insulating layer is provided with adhesive on both sides and insulates the fuse array from the conductor array.

Figure 15:
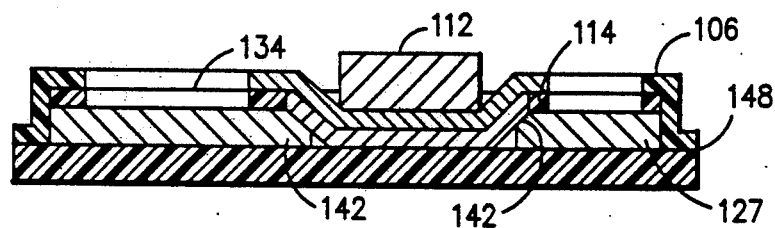
FIG. 15 is a cross-sectional view of the completed fused link structure in accordance with the second embodiment of the invention.

As illustrated in FIG. 15, in the final lamination, the fuse link 114 connects between the end elements 142 of the conductor, by the cold weld process, to provide a fused conductor. In the final lamination process, the precisely registered circuit pattern and fuse array are laminated using heat and pressure. The laminating process forces the force concentrator 112 and the fuse link 114 into the gap 128 between the conductor ends 142, thereby completing a circuit as the fuse link connects those conductor ends. The cold weld or pressure fusion of the fuse link to the conductor ends is an advantageous by-product of the lamination process. In addition, in this embodiment of the invention, the conductor pads for connecting component elements to the flexible circuit conductors, are illustrated below the surface of the conductor. Further, as indicated in connection with the earlier embodiment of this invention, an overlayer of insulating material 148 for protecting the fuses can also be provided.

Figure 16:
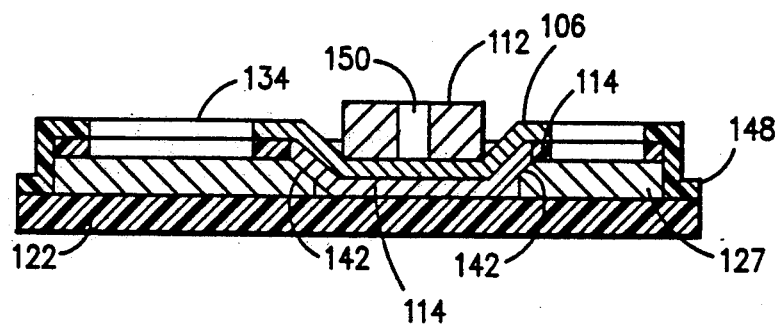
FIG. 16 is a cross-sectional view of a fused link array incorporating optional, controlled venting ports in accordance with the second illustrated embodiment of the invention.

Referring to FIG. 16, this construction of the circuit can also be modified to provide a controlled existing port 150 at and through the force concentrator. Thus, the force concentrator can be shaped to include, for example by etching, drilling, or through a router, one or more venting ports 150 in those applications which require a controlled discharge. In this instance, the invention preferably uses a thicker base insulating material 122 to force the discharge up and through the venting ports.

The support stabilizer 112 thus performs not only the functions described in connection with the embodiment of FIGS. 2–9, but in addition, is modified and configured to act as a force concentrator. The force concentrator forces the fuse link into the gap between the conductor ends, causing it to pressure fuse to the conductors, as a byproduct of the lamination process, and in addition performs the primary functions of registering the fuse to its conductor network, distributing the required force necessary to affect pressure fusion of the fused material to its conductor network during the lamination process, supporting the fuse while not restricting required circuit flexibility, acting as a heat sink, thus controlling the fuse's functional characteristics during an overload condition, and acting, if necessary, as a focused venting port in those applications requiring a controlled discharge. The controlled venting ports can be internally plated or treated, as desired, to prevent wall deterioration and to enhance their functional capabilities. This particular embodiment of the invention is also applicable to rigid circuit board conductors having thicknesses of between 0.005" and 0.01".

Of course, various applications of the invention can be envisioned. For example, a circuit similar to circuit 10 can be programmed to establish connections only between chosen conductors of that circuit. To accomplish this, a fusing current is applied to the paths 14 of the circuit not chosen that will blow the fuses 22 connected to those paths. In this way, those paths of the circuit not chosen can be broken or open-circuited, leaving the chosen paths of the circuit intact.

It will thus be seen that the objects set forth above, among those made apparent from the preceding description, are efficiently attained, and, since certain changes can be made in the above methods and in the above constructions without departing from the scope of the invention, it is intended that all matter contained in the above description or shown in the accompanying drawings be interpreted as illustrative and not in a limiting sense.

It is also to be understood that the following claims are intended to cover all of the generic and specific features of the invention herein described.

What is claimed is:

1. A fusible circuit comprising
   a dielectric substrate;
   one or more electrical circuit paths adhered to said substrate, at least one of said paths being a fused path, said fused path having
   a layer of electrically conductive material defining a gap between juxtaposed ends in said path,
   a layer of fusible material extending between said ends and pressure welded into said gap of said conductive material at said ends, and
   a force concentrator means fixed relative to said fusible layer and disposed in registration with and remote from said gap,
   whereby electrical current flowing along said fused path is conducted primarily through said conductive material layer except at the location of each said gap where it is connected solely through said fusible material layer.

2. The circuit defined in claim 1 wherein said substrate is flexible and is laminated to the conductive material layer of said fused path.

3. The circuit defined in claim 2 and further including a dielectric layer laminated to the conductive material layer of said fused path.

4. The circuit defined in claim 3 and further including means defining a window in said dielectric layer directly opposite said gap in the electrically conductive layer of said fused path.

5. The circuit defined in claim 3 wherein said force concentrator means is a force concentrating layer adhered in a position opposite said gap.

6. The circuit defined in claim 5 further wherein said force concentrating layer comprises a venting port for controlling debris discharge.

7. The circuit defined in claim 1 further comprising a dielectric layer laminated to and between the fusible layer and the force concentrator means.

8. The circuit defined in claim 2 wherein the force concentrator means forms an integral part of the fusible circuit thereby to support the fused circuit at said fusible layer without restricting circuit flexibility where desired.

9. The method of making a fusible printed circuit comprising the steps of
   forming a dielectric substrate;
   forming one or more conductive paths of the printed circuit on the substrate, at least one said path having a gap between juxtaposed conductor ends, and
   cold welding a layer of fusible material to said juxtaposed ends of said gapped conductive path by the use of a force concentration element, fixed relative to said fusible layer and disposed opposite to and remote from said gap, to force the fusible layer and the force concentrator element into said gap.

10. The method defined in claim 9 wherein the step of cold welding comprises laminating said force concentration element, said fusible material, and said conductive paths.

* * * * *

UNITED STATES PATENT AND TRADEMARK OFFICE
CERTIFICATE OF CORRECTION

PATENT NO. : 5,196,819
DATED : March 23, 1993
INVENTOR(S) : Joseph A. Roberts

It is certified that error appears in the above-indentified patent and that said Letters Patent is hereby corrected as shown below:

Column 10, line 7, "connected" should read --conducted-- line 35, ";" should read --,--

Signed and Sealed this

Sixteenth Day of November, 1993

*Attest:*

BRUCE LEHMAN

*Attesting Officer*     Commissioner of Patents and Trademarks